(12) United States Patent
Menard et al.

(10) Patent No.: US 7,872,522 B2
(45) Date of Patent: Jan. 18, 2011

(54) NOISE REDUCTION SYSTEM AND METHOD FOR AUDIO SWITCHING AMPLIFIER

(75) Inventors: Gabriel Menard, Medford, MA (US); Eric Gaalaas, Bedford, MA (US)

(73) Assignee: Analog Devices, Inc., Norwood, MA (US)

( * ) Notice: Subject to any disclaimer, the term of this patent is extended or adjusted under 35 U.S.C. 154(b) by 1099 days.

(21) Appl. No.: 11/599,877

(22) Filed: Nov. 15, 2006

(65) Prior Publication Data

US 2008/0111620 A1 May 15, 2008

(51) Int. Cl.
*H03F 3/38* (2006.01)

(52) U.S. Cl. .......................... 330/10; 381/94.1; 381/94.5

(58) Field of Classification Search ................. 381/94.1, 381/94.5, 59, 121; 310/51, 207 A, 251, 264, 310/269, 277, 285; 323/315; 341/143; 330/10, 330/207 A, 251; 375/238, 239; 327/238, 327/239
See application file for complete search history.

(56) References Cited

U.S. PATENT DOCUMENTS

| | | | |
|---|---|---|---|
| 4,673,889 A | | 6/1987 | Cini et al. |
| 5,805,020 A | * | 9/1998 | Danz et al. ..................... 330/10 |
| 6,191,676 B1 | | 2/2001 | Gabor |
| 6,384,678 B2 | | 5/2002 | Berkhout |
| 6,720,825 B2 | * | 4/2004 | Hansen et al. ................. 330/10 |
| 6,998,911 B2 | | 2/2006 | Honda et al. |
| 7,312,654 B2 | * | 12/2007 | Roeckner et al. .............. 330/10 |
| 2004/0217808 A1 | | 11/2004 | Kim et al. |
| 2005/0083115 A1 | | 4/2005 | Risbo |
| 2006/0082352 A1 | | 4/2006 | Warita et al. |
| 2006/0152281 A1 | | 7/2006 | May |

FOREIGN PATENT DOCUMENTS

| | | |
|---|---|---|
| EP | 0817371 A1 | 1/1998 |
| EP | 1418666 A1 | 5/2004 |
| WO | WO 00/27028 | 5/2000 |
| WO | WO 01/91285 | 11/2001 |

OTHER PUBLICATIONS

Eric Gaalaas, *Class D Audio Amplifiers: What, Why, and How*, 40-06 Analog Dialogue, pp. 1-7 (Jun. 2006) <http://www.analog.com/analogdialog>.

* cited by examiner

*Primary Examiner*—Vivian Chin
*Assistant Examiner*—Friedrich Fahnert
(74) *Attorney, Agent, or Firm*—Kenyon & Kenyon LLP (57) ABSTRACT

Noise reduction for a switching amplifier system having a differential output stage and demodulator filter responsive to complementary PWM signals includes generating in-phase PWM signals and gradually adjusting their duty cycle between a low duty cycle and the full duty cycle of the complementary PWM signals, generating full duty cycle PWM signals and gradually shifting their relative phase between in-phase and out-of-phase; and in response to a turn-on signal, adjusting the in-phase PWM signals from low to full duty cycle and shifting the relative phase from in-phase to out-of-phase, and in response to a turn-off signal shifting the relative phase from out-of-phase to in-phase and adjusting the in-phase PWM signals from full to low duty cycle for maintaining balanced charge on the demodulation filter to reduce audible noise.

20 Claims, 9 Drawing Sheets

FIG. 14

NOISE REDUCTION SYSTEM AND METHOD FOR AUDIO SWITCHING AMPLIFIER

FIELD OF THE INVENTION

This invention relates to a noise reduction system and method which reduces audible noise upon turn-on (un-muting) and turn-off (muting) in an audio switching amplifier.

BACKGROUND OF THE INVENTION

Switching audio amplifiers achieve high power efficiency by using a special (switching) output stage, which outputs pulses that switch between the positive power supply voltage and negative power supply voltage of the output stage. To produce the pulses, the output stage contains switches to connect its output to the desired power supply. The pulse waveform minimizes v*i power dissipation across the switches, resulting in significantly less power consumption than 'linear' output stages, which can produce any voltage between the power supply levels, but at the cost of larger voltage drops and power consumption in the output-producing circuit elements.

In a switching audio amplifier, a modulator converts an input audio signal into a pulse sequence for use in the switching output stage. Typical modulators replicate the desired audio frequencies in the spectrum of the output pulses, with techniques like varying the pulse width in proportion to the input audio signal (pulse-width modulation, or PWM), or using pulses with unit width but varying their density in the pulse sequence in proportion to the input audio signal (pulse-density modulation, or PDM). However, the pulses also contain undesirable high-frequency energy, which can interfere with other electronics, or lead to undesirable noises or heating if input directly to the speaker. Consequently, a low-pass 'demodulation' filter is often inserted between the switching output stage and speaker, to remove high-frequency noise while passing desired audio frequencies. Power dissipation in the filter elements must be minimal to retain high power efficiency overall for the amplifier system, and so a passive, LC filter is generally used. There are many possible modulation schemes, and either single-ended or differential amplifier implementations are possible.

A troublesome design problem in differential switching PWM amplifiers with demodulation filters is how to avoid undesirable clicks and pops (audible noise) when turning them on or off, muting or un-muting and the like. When the amplifier is completely off, demodulation filter capacitors are discharged, and the output stage is not switching (no pulses). This is very different from the zero-output condition when the amplifier is on. Here, the capacitors in the demodulation filter are charged and the output stage is producing the PWM representation of 0 signal, which is pulses with 50% duty cycle. In conventional 2-level differential modulation, there are + and − pulse signals which have 180 degrees phase difference. The challenge is to somehow accomplish a transition between these dissimilar operating states without producing objectionable audible noise, clicks or pops, at the speaker.

A traditional prior art solution is to insert a relay between each speaker terminal and the demodulation filter. The relay is kept open during amplifier turn-on or turn-off, and is only closed after any undesirable transients have settled. This prevents problematic transients from reaching the speaker, but has disadvantages of extra cost and space. A second prior art solution is to start or stop modulation only when the positive power supply to the output stage is low. When the modulation is on, the power supply voltage is slowly ramped to or from the desired operating value depending on whether the modulation is being started or stopped. This approach requires a special power supply which is capable of being ramped up and down, significantly increasing complexity and cost. See U.S. Pat. No. 6,720,825.

More recent prior art solutions overcome the disadvantages of the first two by using special pulse sequences to minimize energy at audio frequencies during transitions between the OFF and ZERO-SWITCHING states. U.S. Pat. Nos. 6,384,678 and 6,720,825).

BRIEF SUMMARY OF THE INVENTION

It is therefore an object of this invention to provide an improved noise reduction system and method which reduces audible noise (clicks and pops) upon turn-on (un-muting) and turn-off (muting).

It is a further object of this invention to provide such an improved noise reduction system and method which is less sensitive to mismatch in filter components and small timing errors in start-up pulses.

It is a further object of this invention to provide such an improved noise reduction system and method which eliminates the cost, size and complexity associated with external relays.

It is a further object of this invention to provide such an improved noise reduction system and method which uses fewer components.

It is a further object of this invention to provide such an improved noise reduction system and method which integrates well with the modulator especially digital modulators.

The invention results from the realization that noise reduction for a switching amplifier system including a differential output stage and demodulator filter responsive to complementary PWM signals can be achieved by generating in-phase PWM signals and gradually changing their duty cycle between a low duty cycle and the full duty cycle of the complementary PWM signals, generating fill duty cycle PWM signals and gradually shifting their relative phase between in-phase and out-of-phase, and in response to a turn-on signal changing the in-phase PWM signals from low to full duty cycle and shifting the relative phase from in-phase to out-of-phase, and/or in response to a turn-off signal shifting the relative phase from out-of-phase to in-phase and changing the in-phase PWM signals from full to low duty cycle for maintaining balanced charge on the demodulation filter to reduce audible noise.

The subject invention, however, in other embodiments, need not achieve all these objectives and the claims hereof should not be limited to structures or methods capable of achieving these objectives.

This invention features a noise reduction system for a switching amplifier system including a differential output stage and demodulator filter responsive to complementary PWM signals, the noise reduction system including a charging circuit for generating in-phase PWM signals and gradually adjusting their duty cycle between a low duty cycle and the full duty cycle of the complementary PWM signals; an out-phasing circuit for generating full duty cycle PWM signals and gradually shifting their relative phase between in-phase and out-of-phase; and a control circuit responsive to a turn-on signal to enable the charging circuit to adjust the in-phase PWM signals from low to full duty cycle and enable the out-phasing circuit to shift the relative phase from in-phase to out-of-phase, and responsive to a turn-off signal to enable the out-phasing circuit to shift the relative phase from out-of-phase to in-phase and enable the charging circuit to adjust the in-phase PWM signals from full to low duty cycle for maintaining balanced charge on the demodulation filter to reduce audible noise In a preferred embodiment the noise reduction system may further include a synchronization circuit for synchronizing the out-of-phase full duty cycle PWM signals from the out-phasing circuit with the complementary PWM signals. The control circuit may include a multiplexer and a state machine. The full duty cycle may be a 50% duty cycle. The charging circuit may include a first pulse generator circuit for providing in-phase PWM signals with fixed high time and a second pulse generator circuit, responsive to the first pulse generator circuit, for modifying the pulse period of the PWM signals each time a pulse period occurs until the desired duty cycle is reached by adjusting the duty cycle of the PWM signals between low and full duty cycles. The pulse period may be modified by being reduced. The pulse period may be modified by being increased. The charging circuit may further include an adjustment circuit for setting the rate of modifying the pulse period. The out-phasing circuit may include a first pulse generating device for generating a first full duty cycle pulse, and a second pulse generating device for generating a second full duty cycle pulse. There may be a first phase shifting circuit for gradually for gradually shifting the relative phase of the first and second full duty cycle pulses from in-phase to out-of-phase and a phase comparator for detecting when the pulses are out-of-phase. There may be a first phase shifting circuit for gradually shifting the relative phase of the first and second full duty cycle pulses from out-of-phase to in-phase and a phase comparator for detecting when the pulses are in-phase. The synchronizer circuit may include a phase shifting circuit for, in response to a turn-on signal, gradually shifting the phase of the full duty cycle PWM signals from out-of-phase to in-phase with the complementary PWM signals. The synchronizer circuit may include a phase detector for, in response to a turn-off signal, sensing when the full duty cycle PWM signals are in-phase with the complementary PWM signals and sending a start signal to the out-phasing circuit.

This invention also features a method of noise reduction for a switching amplifier system including a differential output stage and demodulator filter responsive to complementary PWM signals including generating in-phase PWM signals and gradually adjusting their duty cycle between a low duty cycle and the full duty cycle of the complementary PWM signals; generating full duty cycle PWM signals and gradually shifting their relative phase between in-phase and out-of-phase; and in response to a turn-on signal, adjusting the in-phase PWM signals from low to full duty cycle and shifting the relative phase from in-phase to out-of-phase, and in response to a turn-off signal shifting the relative phase from out-of-phase to in-phase and adjusting the in-phase PWM signals from full to low duty cycle for maintaining balanced charge on the demodulation filter to reduce audible noise.

In a preferred embodiment there may be a synchronization circuit for synchronizing synchronizing the out-of-phase full duty cycle PWM signals from the out-phasing circuit with the complementary PWM signals. The full duty cycle may be a 50% duty cycle.

This invention also features a noise reduction system for a switching amplifier system including a differential output stage and demodulator filter responsive to complementary PWM signals, the noise reduction system including a charging circuit for generating in-phase PWM signals and gradually adjusting their duty cycle between a low duty cycle and the full duty cycle of the complementary PWM signals; an out-phasing circuit for generating full duty cycle PWM signals and gradually shifting their relative phase between in-phase and out-of-phase; and a control circuit responsive to a turn-on signal to enable the charging circuit to adjust the in-phase PWM signals from low to full duty cycle and enable the out-phasing circuit to shift the relative phase from in-phase to out-of-phase, for maintaining balanced charge on the demodulation filter to reduce audible noise.

This invention also features a noise reduction system for a switching amplifier system including a differential output stage and demodulator filter responsive to complementary PWM signals, the noise reduction system including a charging circuit for generating in-phase PWM signals and gradually adjusting their duty cycle between a low duty cycle and the full duty cycle of the complementary PWM signals. An out-phasing circuit for generating full duty cycle PWM signals and gradually shifting their relative phase between in-phase and out-of-phase; and a control circuit responsive to a turn-off signal to enable the out-phasing circuit to shift the relative phase from out-of-phase to in -phase and enable the charging circuit to adjust the in-phase PWM signals from full to low duty cycle for maintaining balanced charge on the demodulation filter to reduce audible noise.

This invention also features a method of noise reduction for a switching amplifier system including a differential output stage and demodulator filter responsive to complementary PWM signals including generating in-phase PWM signals and gradually adjusting their duty cycle between a low duty cycle and the full duty cycle of the complementary PWM signals; generating full duty cycle PWM signals and gradually shifting their relative phase between in-phase and out-of-phase; and in response to a turn-on signal adjusting the in-phase PWM signals from low to full duty cycle and shifting the relative phase from in-phase to out-of-phase, for maintaining balanced charge on the demodulation filter to reduce audible noise.

This invention also features a method of noise reduction for a switching amplifier system including a differential output stage and demodulator filter responsive to complementary PWM signals including generating in-phase PWM signals and gradually adjusting their duty cycle between a low duty cycle and the full duty cycle of the complementary PWM signals; generating full duty cycle PWM signals and gradually shifting their relative phase between in-phase and out-of-phase; and in response to a turn-off signal, shifting the relative phase from out-of-phase to in-phase and adjusting the in-phase PWM signals from full to low duty cycle for maintaining balanced charge on the demodulation filter to reduce audible noise.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
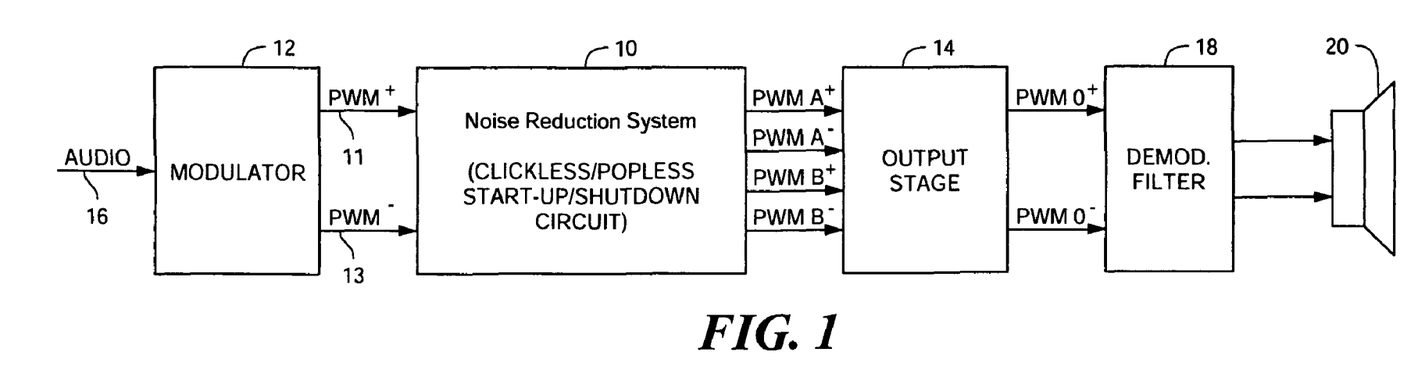
FIG. 1 is a schematic block diagram of a switching amplifier system with a noise reduction system according to this invention.

There is shown in FIG. 1 a differential audio switching amplifier with a noise reduction system 10 according to this invention also known as a clickless/popless start -up/shutdown circuit.

An audio input 16 is delivered to modulator 12 which provides at least one pulse width modulation signal PWM+ 11 from which can be generated the inverse or out-of-phase signal PWM– 13 or modulator 12 can deliver both complementary PWM signals to noise reduction system 10. In the absence of noise reduction system 10, complementary PWM+ and PWM– signals, which are out-of-phase or the inverse of each other, are used to generate PWMA+, and the opposite phase or inverse of it, PWMA–, along with PWMB+, which is out-of-phase or the inverse of PWMA+, and PWMB–, which is out-of-phase or the inverse of PWMB+. These signals are used to drive output stage 14 to reconstruct, at higher power, the audio input signal delivered at 16 to modulator 12. The output of stage output of stage 14 is high-power pulse width modulated signals PWMO+ and PWMO– which are delivered to demodulation filter 18 which filters the input and provides to a load, such as speaker 20, a much higher power version of the signal appearing at input 16.

Figure 2:
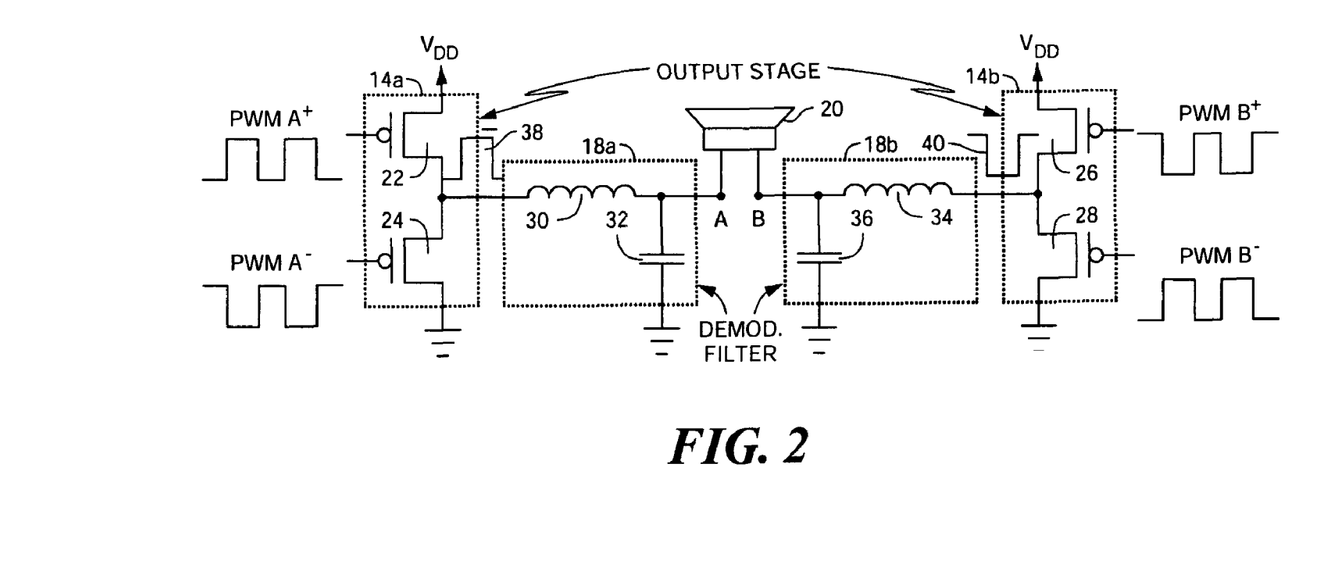
FIG. 2 is a more detailed schematic of the output stage and demodulation filter of FIG. 1.

Output stage 14 being a differential stage has two sections 14a and 14b, FIG. 2, each of which includes two switching transistors 22, 24, 26 and 28, respectively. Section 14a receives input switching signals PWMA+ and PWMA– which are the inverse of one another. Switching circuit 14b receives switching inputs PWMB+ and PWMB– which are inverse of one another. In addition, PWMB+ is the inverse of PWMA+ and thus the same as PWMA–. PWMB– is the same as PWMA+ and therefore the inverse PWMA–. In further discussions herein, especially with reference to FIGS. 5-12 the waveforms are illustrated using PWMA+/B– with the understanding that the other waveforms PWMA–/B+ are simply the inverse of those. Demodulation filter 18 also includes two sections 18a and 18b. Normally, in this discussion the PWM signals PWM+, PWM–, PWMA+, PWMA–, PWMB+, PWMB– have 50% duty cycles.

In keeping with the differential configuration, demodulation filter 18 includes two sections 18a and 18b. Each section includes an inductance and a capacitor: for example, inductance 30 and capacitor 32 in filter section 18a and inductance 34 and capacitor 36 in filter section 18b. In normal operation node A receives a signal having one phase as indicated at 38 while node B receives a signal of the opposite phase, 40. This difference in the voltages at A and B can cause clicks, pops, or other audible noise from speaker 20 at turn-on (un-mute) and turnoff (mute) of the system.

To reduce this noise this invention discloses the technique whereby at turn-on the PWM signals 38 and 40 are in-phase (0° phase difference) and have a low duty cycle. A charging circuit increases the duty cycle from a low level to a full duty cycle. The full duty cycle is defined as that duty cycle normally provided by modulator 12 when audio input 16 is zero: typically 50%. This keeps the charge balanced on capacitors 32 and 36 and minimizes voltage difference between A and B, thereby reducing the audible noise. Next, an out-phasing circuit generates the full cycle PWM signals, but in-phase, so that there is substantially equal signal on each capacitor 32, 36 in nodes A and B. The relative phase of these PWM signals is then gradually shifted until they are out-of-phase (180° phase difference). At this point the full cycle out-of-phase signals are synchronized with those being produced by modulator 12 and modulator 12 then takes over providing the PWMA+, A–, B+, B– signals to output stage 14. At turn off or muting, synchronization is assured between the signals being provided by modulator 12 and those present at the output of the out-phasing circuit. When they are synchronized, the out-phasing circuit then gradually shifts the phase until the signals produced by it are in-phase with one another. After this the charging circuit takes over and gradually decreases the duty cycle from the full duty cycle, e.g. 50% to a much lower duty cycle so that the capacitors are evenly and uniformly discharged at turn-off.

Figure 3:
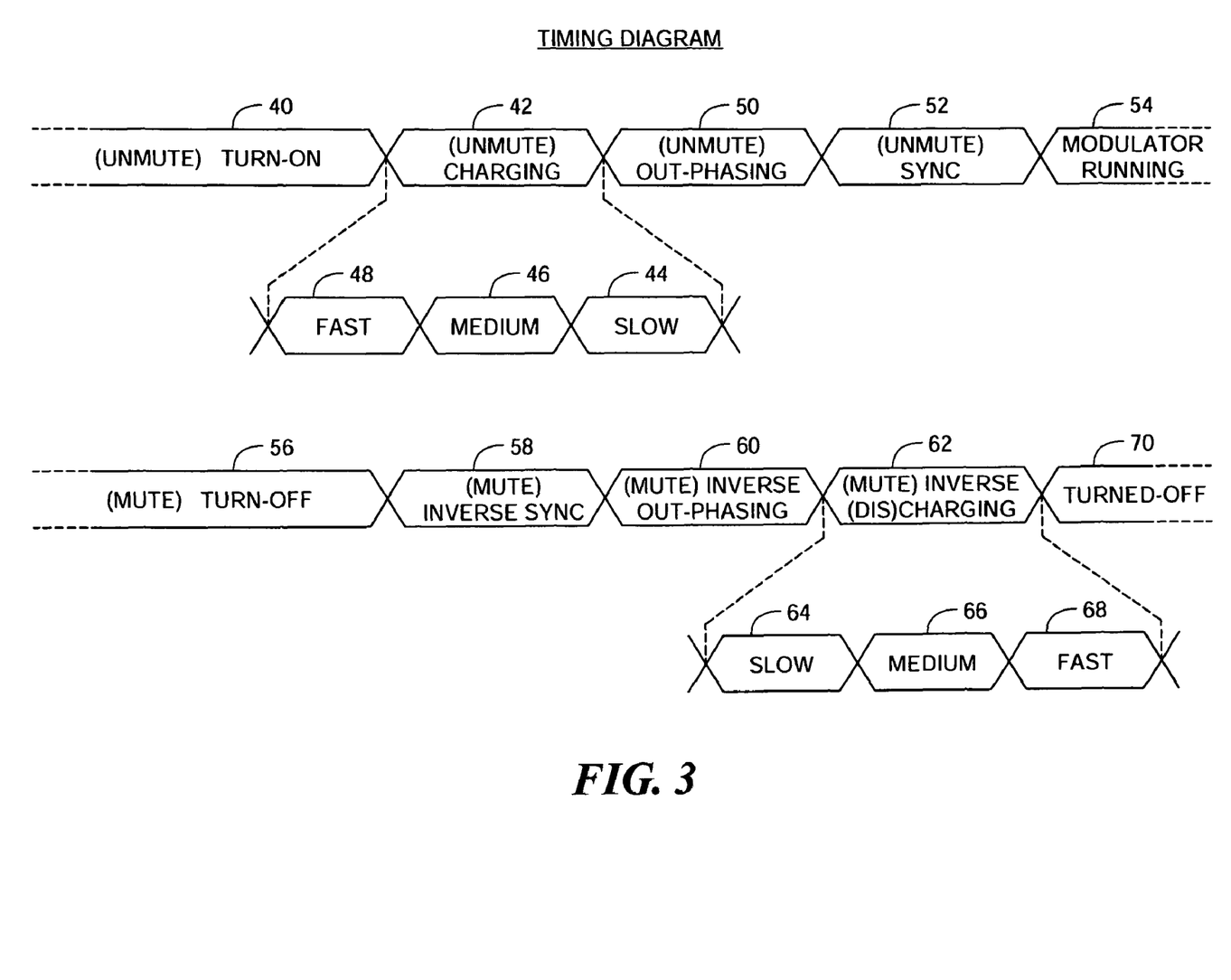
FIG. 3 is a timing diagram illustrating un-muting (turn-on) and muting (turn-off) sequences of operation of the noise reduction system of this invention.

The timing diagram in FIG. 3 shows that upon un-muting or turning-on of the system 40, the charging circuit 42 begins to operate at a predetermined rate shown simply here by slow 44, medium 46, or fast 48 speeds, although any desired rate could be used to generate pulse width modulated signals and bring them from a low duty cycle to full duty cycle matching that of modulator 12. Then out-phasing 50 begins with the full duty cycle PWM signals being shifted from in-phase to out-of-phase after which synchronization is effected between the full cycle, out-of-phase PWM, signals from the out-phasing circuit with the PWM complementary signals from modulator 12. Once that has occurred the modulator 54 is running the output stage and demodulation filter and this will continue while the system is in operation. At muting or turn-off 56 an inverse synchronization 58 occurs whereby the full duty cycle, out-of-phase PWM signals generated by the out-phasing circuit are synchronized with the complementary PWM signals from modulator 12. Inverse out-phasing 60 then occurs whereby the phase of the full duty cycle PWM signals are shifted from out-of-phase with each other to in-phase. Following this, inverse charging or discharging occurs 62 whereby the out-of-phase signals are now gradually changed to low duty cycle PWM signals at some rate, for example, slow 64, medium 66, fast 68, and the system is turned off 70.

Figure 4:
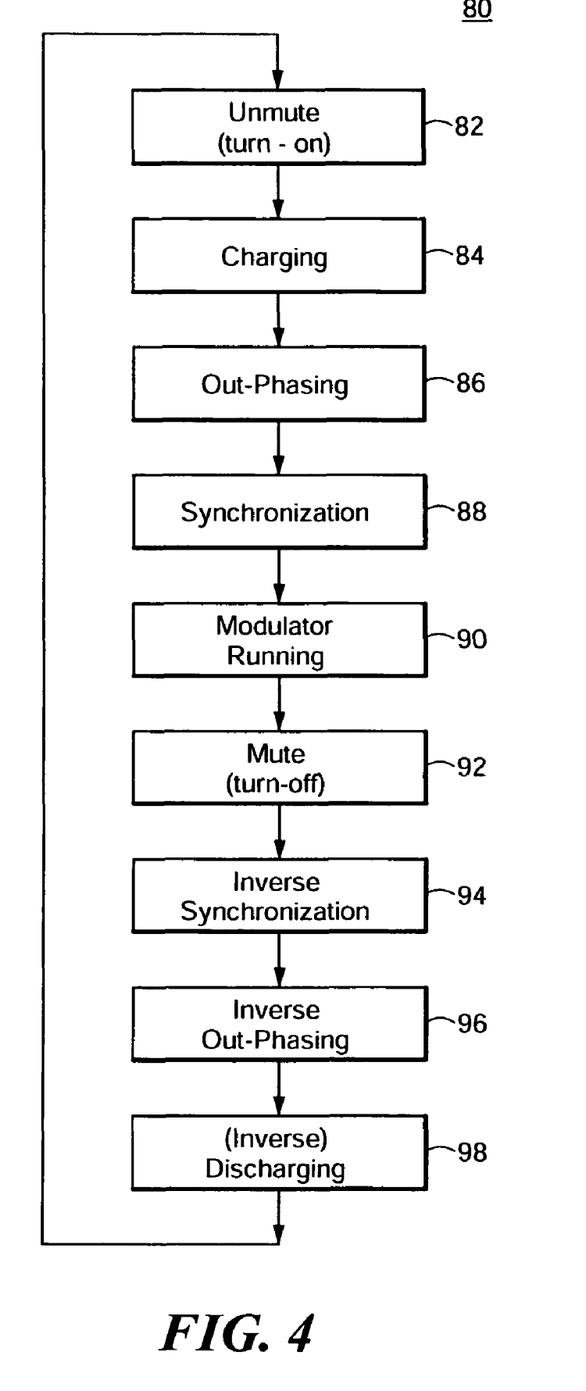
FIG. 4 is a state transition diagram of a state machine for controlling the turn-on and turn-off operations.

A state machine 80, FIG. 4, controls the sequencing of the operation of the charging circuit, the out-phasing circuit and the synchronizing circuit in the turn-on (un-muting) and turn-off (muting) modes. The state machine could be implemented in e.g., discrete logic, or code in a micro-processor, or gates in an FPGA, or gates in an ASIC. At un-mute 82 the system steps to the charging operation 84. When the charging circuit has generated in-phase PWM signals with full duty cycle, then out-phasing 86 is effected to shift the full duty cycle, in-phase PWM signals to full duty cycle, out-of-phase PWM signals. The full cycle, out-of-phase PWM signals are then synchronized 88 with the complementary PWM signals provided by modulator 12. Modulator 12 then takes over running the system 90. Upon a mute or turn-off 92, inverse synchronization occurs whereby the full duty cycle, out-of-phase PWM signals are synchronized with the complementary PWM signals being delivered by modulator 12. When these are synchronized, there begins the inverse out -synchronized, there begins the inverse out-phasing in which the phase of the full duty cycle PWM signals is shifted until they are in-phase 96, after which the inverse charging circuit operates 98 to gradually reduce the full duty cycle of the PWM signals to a low duty cycle, for example 0.5% duty cycle.

Figure 5:
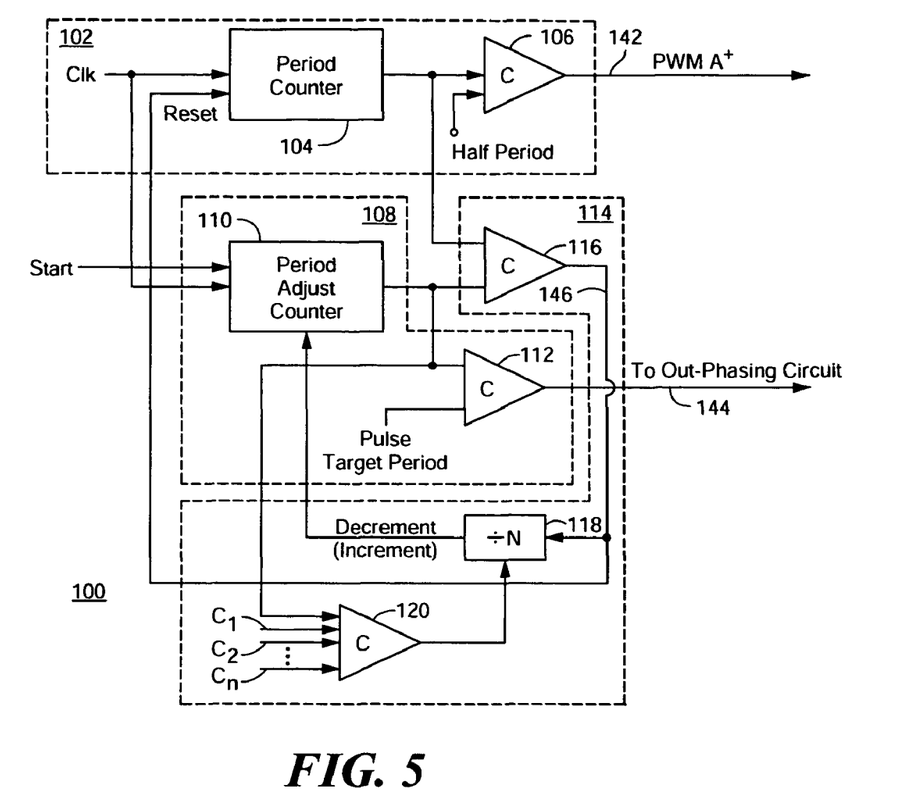
FIG. 5 is a schematic block diagram of one embodiment of a charging and inverse charging circuit according to this invention.
Figure 6:
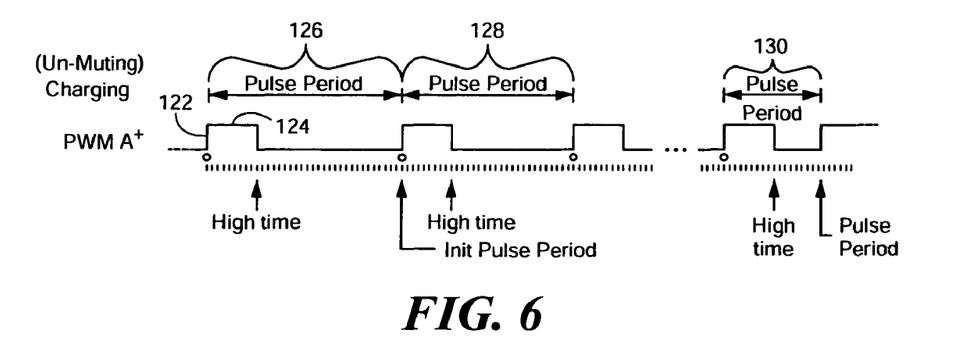
FIGS. 6 and 7 illustrate waveforms generated by the charging and inverse charging operations, respectively, of the circuit of FIG. 5.

One embodiment of a charging circuit 100, FIG. 5, includes a first pulse generator 102 including a period counter 104 and comparator 106. There is a second pulse generator 108 including a period adjust counter 110 and a comparator 112 and an adjustment circuit 114 including comparator 116, divider circuit 118 and comparator 120. The operation of charging circuit 100 is best understood by first referring to FIGS. 6 and 7. FIG. 6 shows the PWMA+/B− waveform 122 during the un-muting, charging operation. The width of pulse 124, also referred to as the high time, remains the same, but the pulse period 126 is decreased each time so that the pulse period 128 is shorter than pulse period 126 until finally at pulse period 130 the pulse period is simply twice the high time. At this point we have what is referred to as a full duty cycle: in this case, a 50% duty cycle PWM signal.

Figure 7:
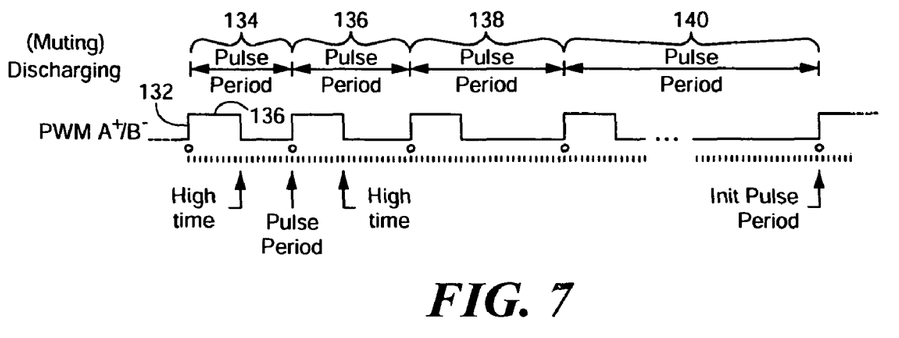

In the muting or turning-off operation the charging is actually an inverse charging, as indicated by waveform 132, FIG. 7. There the pulse period 134 starts out at twice the width of pulse 136 which represents a full duty cycle or 50% duty cycle. The pulse period 136, 138, 140, becomes longer while the pulse 136 high time remains the same so that the duty cycle becomes less and less. Charging circuit 100 accomplishes this as follows. Clock signals are supplied to period counter 104 and period adjust counter 110; for each count of counter 104 with value smaller or equal to half period, the comparator 108 sets high the PWMA+ signal on line 142. Similarly, for each count of counter 104 with value with value greater to half period, the comparator 108 sets low the PWMA+ signal on line 142. The B+, A− and B− signals are generated by the multiplexer of FIG. 13. Period adjust counter 110 also counts the clock pulses. When its output reaches a target pulse period count, comparator 112 provides an output on line 144 to transfer control to the out-phasing circuit. In the charging circuit, the target pulse period equals a 50% duty cycle period and in the discharging circuit, the target pulse period equals a low duty cycle period. Whenever the count in period counter 104 is equal to the count in period adjust counter 110, comparator 116 provides an output on line 146 which resets period counter 104 and also, through divider circuit 118, decrements period adjust counter 110, thereby shortening the pulse period as described in FIG. 6. The value of N in N÷ 118 determines the rate at which the pulse period will be shortened. This can be programmed using comparator 120 which compares the count in period adjust counter 110 with any one of a number of programmable inputs $c_1, c_2 \ldots c_n$ to determine how quickly or slowly the decrementing and thus the pulse period shortening will occur as pictured by 48, 46, and 44 in FIG. 3 (fast, medium and slow).

Charging circuit 100 works the same way during the inverse charging operation illustrated in FIG. 7, but in that case the output from comparator 116 on line 146 delivered through divider 118 is used to increment, not decrement, period adjust counter 110.

Figure 8:
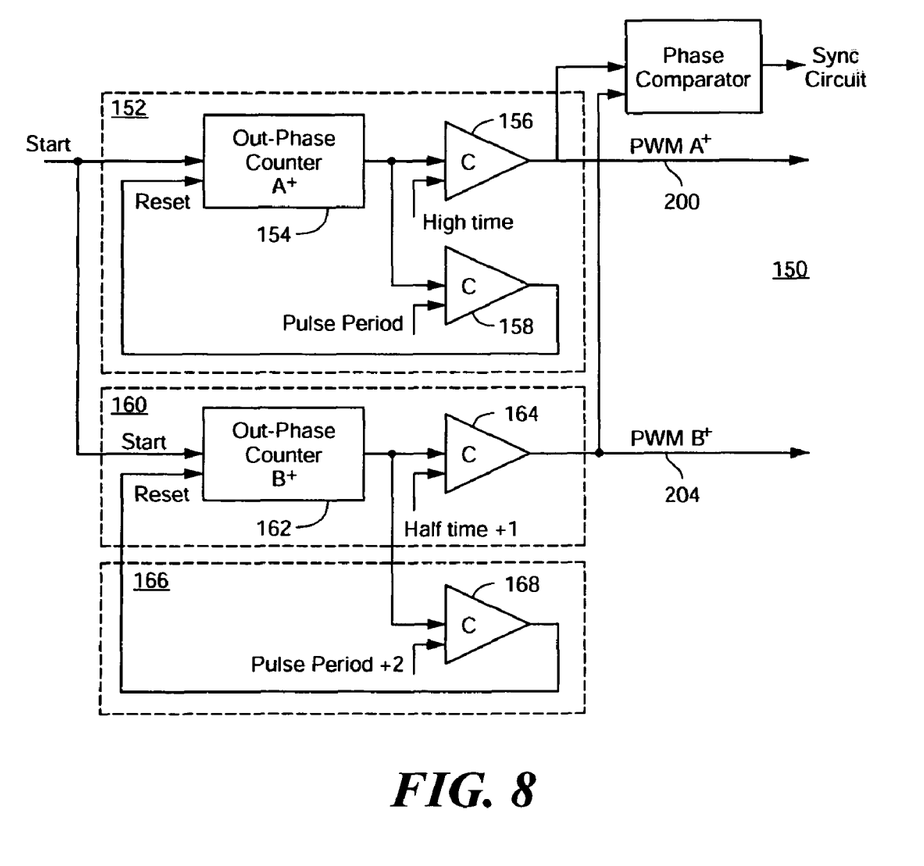
FIG. 8 is a schematic block diagram of one embodiment of an out-phasing circuit, according to this invention.

Out-phasing circuit 150 includes a first pulse generating device 152, FIG. 8, including out-phase counter 154 and high time and pulse period comparators 156 and 158, respectively. There is a second pulse generating device 160 including out-phase counter 162 and high time +1 comparator 164. A phase shifting circuit 166 includes pulse period +2 comparator 168.

Figure 9:
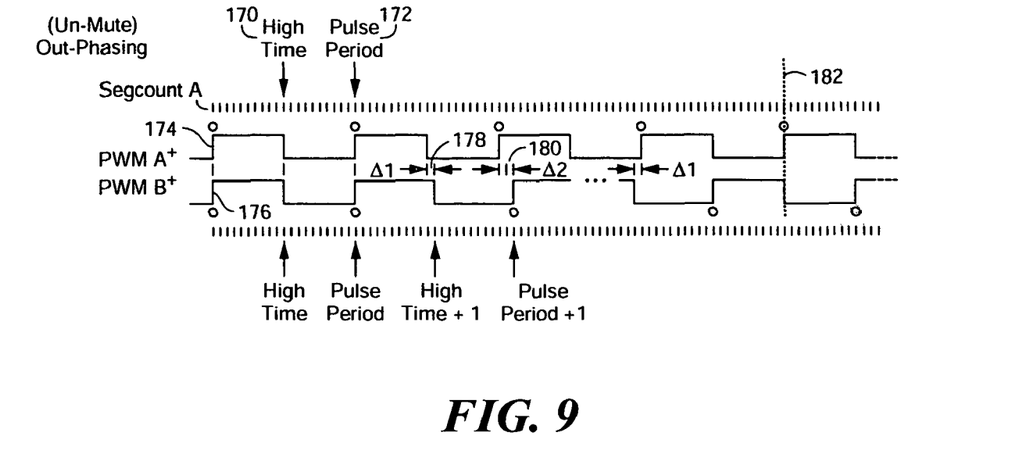
FIGS. 9 and 10 illustrate waveforms generated by the out-phasing, and inverse out-phasing operations, respectively, of the circuit of FIG. 8.
Figure 10:
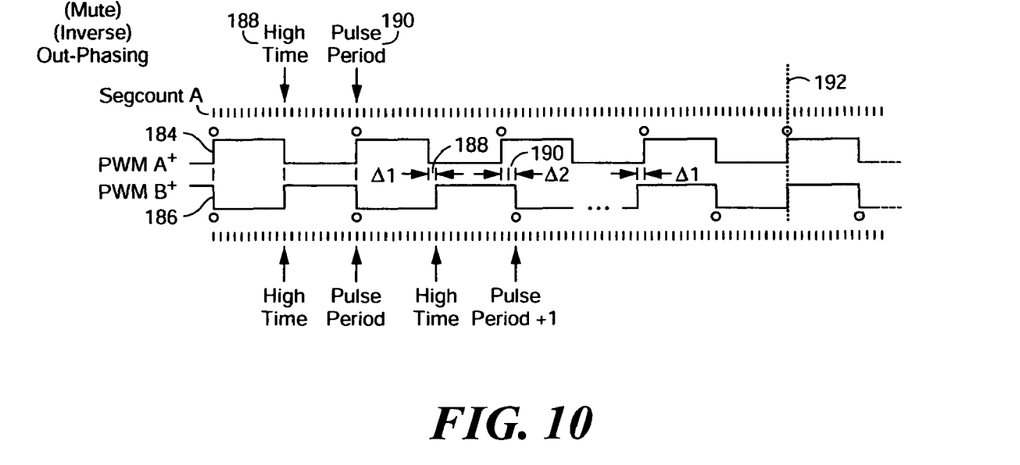

Charging circuit 150 in the un-mute out-phasing, FIG. 9, begins with the PWM signals A and B (and also PWMA−PWMB−) in-phase and at full duty cycle or 50% so that the high time point 170 and pulse period point 172 line up for PWMA+ 174 and PWMB+ 176. However, on the very next cycle the high time is increased by 1 for one of the PWM signals, for example, 176 as shown at 178. The pulse period is extended by two counts as shown as 180 to maintain the duty cycle. This continues until finally at 182, PWMA+ 174 and PWMB+ 176 are out-of-phase. During muting or inverse out-phasing the opposite occurs. There, PWMA+ 184 and PWMB+ 186, FIG. 10, the high time point 188 and pulse period point 190 are out-of-phase. Again, by shifting the high time by one count as at 188 and the pulse period by two counts as at 190 the phase shifts until eventually as shown at 192, PWMA+ 184 and PWMB+ 186 are in-phase.

This is accomplished in FIG. 8 with a start signal to operate out-phase counter A+ 154, and out-phase counter B+ 162. When out-phase counter 154 reaches the count of half a period, comparator 156 provides a PWMA+ output on line 200 and also provides one output to phase comparator 202. When out-phase counter 154 reaches the count of a pulse period, comparator 158 provides a reset signal to start out-phase counter 154 counting again. When out-phase counter 162 reaches a count of a high time +1 comparator 164 produces output PWMB+ on line 204. It also provides a second input to phase comparator 202 which detects when the two are in-phase and provides the signal to the sync circuit. The output of out-phase counter 162 is also provided to comparator 168 and, when a count of pulse period +2 is reached, comparator 168 provides a reset to start out-phase counter 162 counting over again. During a mute operation inverse out-phasing is accomplished in the same way using the high time +1 and pulse period +2 increments to shift the phase. to shift the phase.

Figure 11:
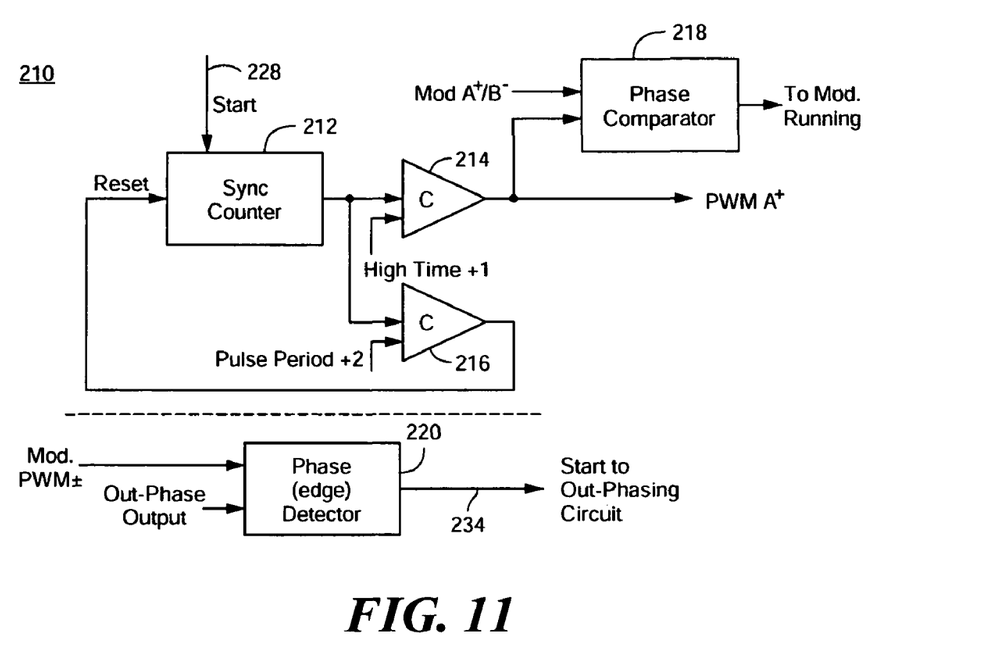
FIG. 11 is a schematic block diagram of one embodiment of a synchronization circuit according to this invention.
Figure 12:
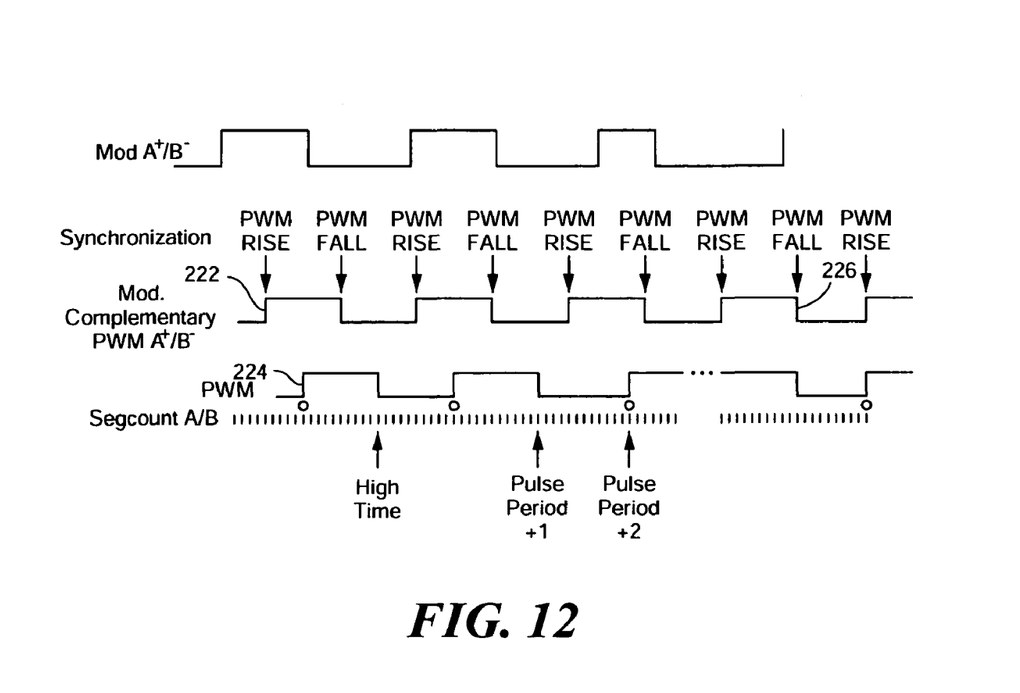
FIG. 12 illustrates a waveform generated by the synchronization circuit of FIG. 11.

The synchronization circuit 210, FIG. 11, includes a sync counter 212, high time +1 counter 214, pulse period +2 counter 216, phase comparator 218, and a phase or edge detector 220. Circuit 210 synchronizes the output generated by the noise reduction system with that of the complementary pulse width modulating signals from modulator 12. This is apparent in FIG. 12 where the modulator complementary PWMA+/B− waveform 222 is shown with the PWMA+/B− waveform 224 provided by the noise reduction system. Here again the high time has a count of 1 added to it, while the pulse period has a count of 2 added, to shift the phase of the noise reduction PWMA+/B− waveform 224 until it coincides as at 226 and is in-phase with the modulator produced complementary PWMA+/B−222. Synchronizing circuit 210 accomplishes this upon receipt of the start signal on line 228 from phase comparator 202, FIG. 8. When the count in sync counter 212, FIG. 11, has reached the count of high time +1, comparator 214 produces PWMA+ signal. When the count in sync counter 212 reaches a pulse period +2, comparator 216 provides a reset to sync counter 212. When the PWMA+ output with comparator 214 is sensed by phase comparator 218 to be in-phase with the modulator A+/B− waveform, an output is provided to introduce the modulator output directly to the output stage. In the turn-off operation the phase detector 220 monitors both the out phase output and the output from the modulator PWM±. When the two are in sync a signal is sent on line 234 to start the out-phase circuit to begin shifting the phase of the signal.

Figure 13:
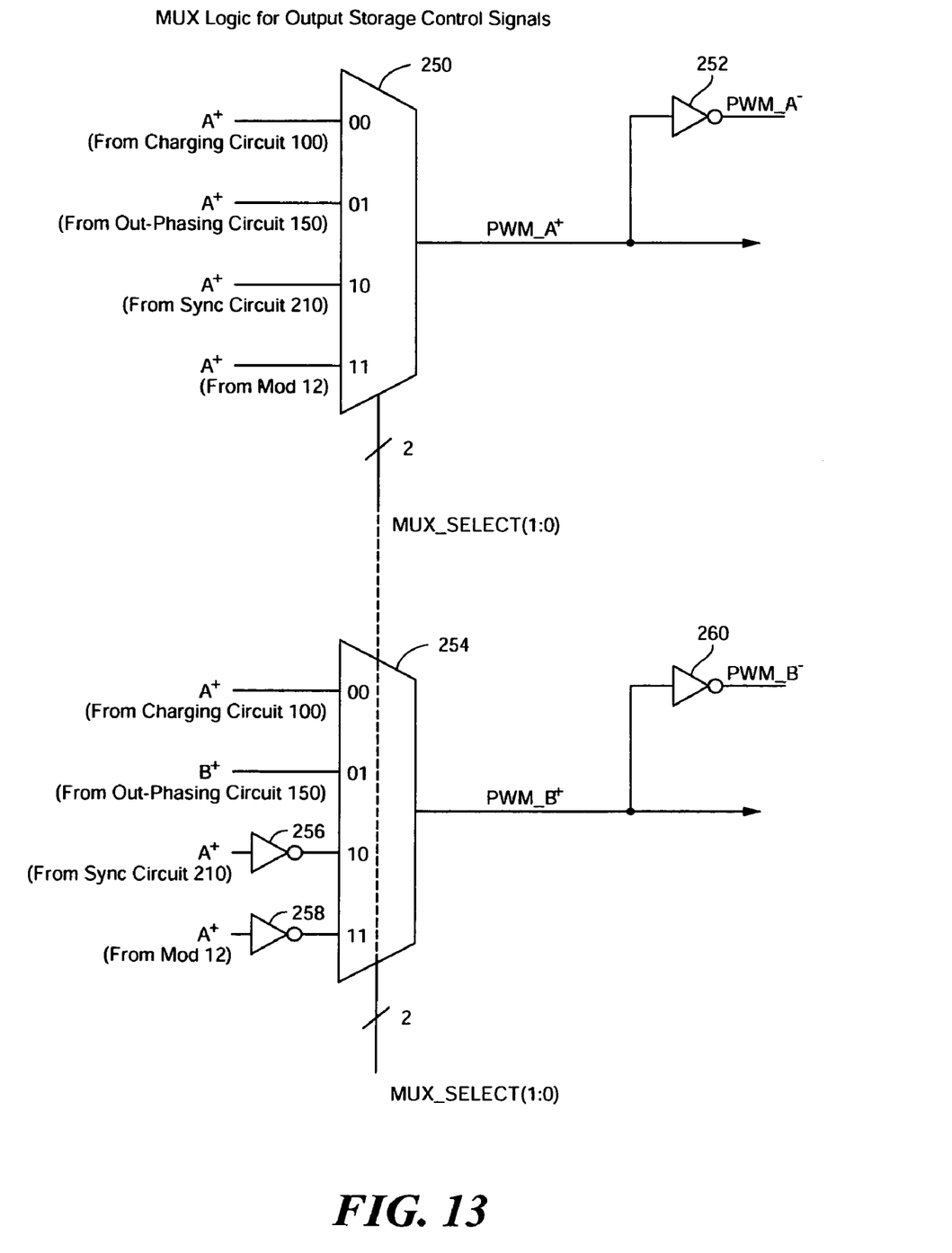
FIG. 13 is a schematic diagram of a multiplexer circuit controlling output stage control signals.

The multiplexer logic for generating the output stage control signals is shown in FIG. 13 where the first section 250 can select from four inputs: A+, from the charging circuit at address 00, A+ from the out-phasing circuit at address 01, A+ from the sync circuit at address 10, and A+ from the modulator at address 11 to produce the PWMA+ and through inverter 252 to provide PWMA−. Likewise multiplexer section 254 has four inputs: A+ from the charging circuit at address 00, B+ from the out-phasing circuit at address 01, A+ from the sync circuit to inverter 256 at address 10, and A+ from the modulator to the inverter 258 at address 11 to provide PWMB+ and through inverter 260, PWMB−.

Figure 14:
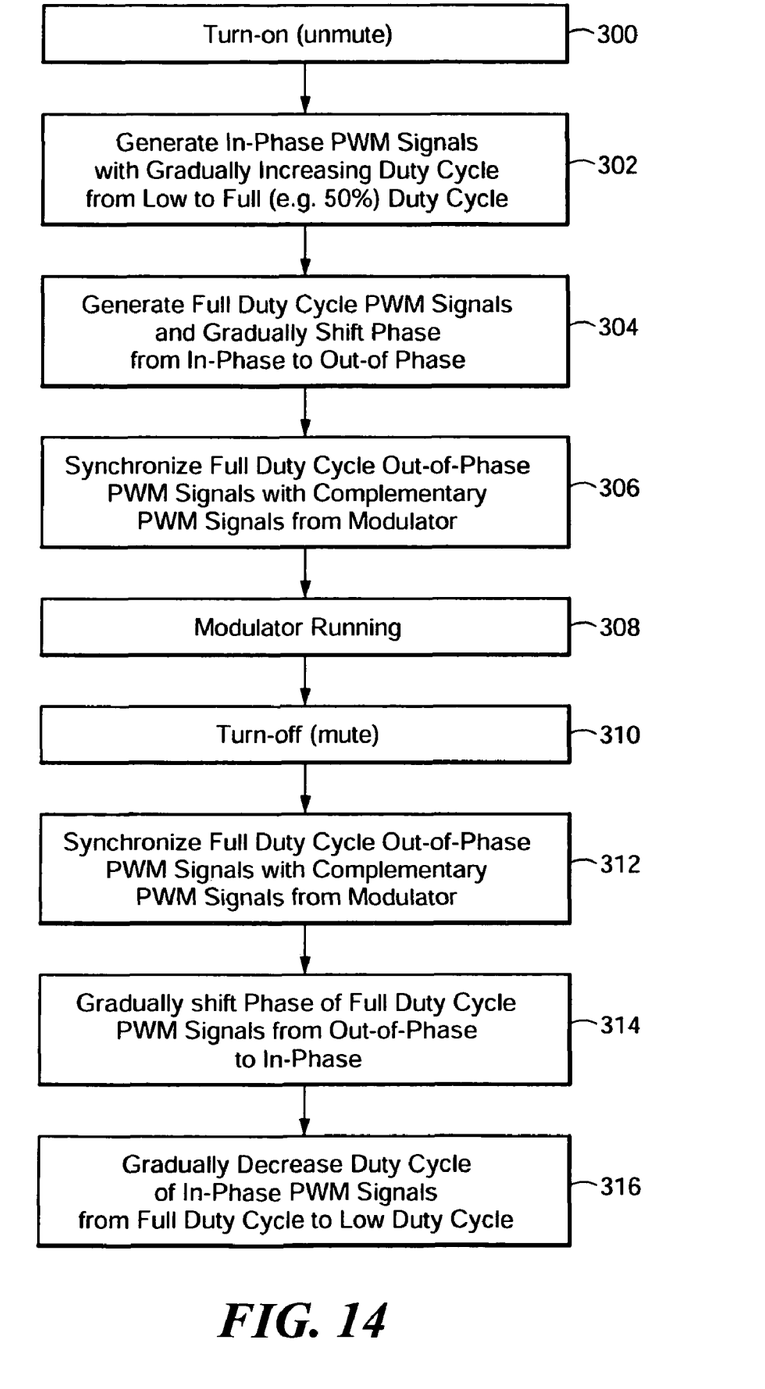
FIG. 14 is a flow diagram of the method of this invention showing both turn-on (un-(un-mute) and turn-off (mute) modes.

While thus far FIGS. 1-13 have disclosed the invention with respect to apparatus the invention also includes the method independent of the hardware as shown in FIG. 14. At turn-on or un-mute 300, in-phase PWM signals are generated with gradually increasing duty cycle from low to full, e.g. 50% duty cycle 302. Then full duty cycle PWM signals are gradually shifted from in-phase to out-of-phase 304. The full duty cycle out-of-phase PWM signals are then synchronized with the complementary PWM signals 306 from the modulator. The modulator then runs the output stage 308. At some subsequent time turn-off or muting may occur 310. Then the full duty cycle, out-of-phase PWM signals from the out-of-phase circuit are synchronized with the complementary PWM signals from the modulator 312. Now the phase of the full duty cycle PWM signals are shifted from out-of-phase to in-phase 314 and then the duty cycle of the in-phase PWM signals are decreased from full duty cycle to some predetermined low duty cycle 316.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A noise reduction system for a switching amplifier system including a differential output stage and demodulator filter responsive to complementary PWM signals, said noise reduction system comprising:

a charging circuit for generating in-phase PWM signals and gradually adjusting their duty cycle between a low duty cycle and the full duty cycle of said complementary PWM signals;

an out-phasing circuit for generating full duty cycle PWM signals and gradually shifting their relative phase between in-phase and out-of-phase; and a control circuit responsive to a turn-on signal to enable said charging circuit to adjust the in-phase PWM signals from low to full duty cycle and enable said out-phasing circuit to shift the relative phase from in-phase to out-of-phase, and responsive to a turn-off signal to enable said out-phasing circuit to shift the relative phase from out-of-phase to in-phase and enable said charging circuit to adjust the in-phase PWM signals from full to low duty cycle for maintaining balanced charge on the demodulation filter to reduce audible noise.

2. The noise reduction system of claim 1 further including a synchronization circuit for synchronizing the out-of-phase full duty cycle PWM signals from the out-phasing circuit with the complementary PWM signals.

3. The noise reduction system of claim 1 in which said control circuit includes a multiplexer and a state machine.

4. The noise reduction system of claim 1 in which said full duty cycle is a 50% duty cycle.

5. The noise reduction system of claim 1 in which said charging circuit includes a first pulse generator circuit for providing in-phase PWM signals when a high time has been reached and a second pulse generator circuit, responsive to said first pulse generator circuit, for modifying the pulse period of said PWM signals each time a pulse period occurs until a desired duty cycle is reached by changing the duty cycle of said PWM signals between low and full duty cycles.

6. The noise reduction system of claim 5 in which the pulse period is modified by being reduced.

7. The noise reduction system of claim 5 in which the pulse period is modified by being increased.

8. The noise reduction system of claim 5 in which said charging circuit further includes an adjustment circuit for setting the rate of modifying the pulse period.

9. The noise reduction system of claim 1 in which said out-phasing circuit includes a first pulse generating device for generating a first full duty cycle pulse, and a second pulse generating device for generating a second full duty cycle pulse.

10. The noise reduction system of claim 9 further including a first phase shifting circuit for gradually shifting the relative phase of said first and second full duty cycle pulses from in-phase to out-of-phase and a phase comparator for detecting when said pulses are out-of-phase.

11. The noise reduction system of claim 9 further including a first phase shifting circuit for gradually shifting the relative phase of said first and second full duty cycle pulses from out-of-phase to in-phase and a phase comparator for detecting when said pulses are in-phase.

12. The noise reduction system of claim 2 in which said synchronizer circuit includes a phase shifting circuit for, in response to a turn-on signal, gradually shifting the phase of said full duty cycle PWM signals from out-of-phase to in-phase with said complementary PWM signals.

13. The noise reduction system of claim 2 in which said synchronizer circuit includes a phase detector for, in response to a turn-off signal, sensing when said full duty cycle PWM signals are in-phase with said complementary PWM signals and sending a start signal to said out-phasing circuit.

14. A method of noise reduction for a switching amplifier system including a differential output stage and demodulator filter responsive to complementary PWM signals comprising:
generating in-phase PWM signals and gradually adjusting their duty cycle between a low duty cycle and the full duty cycle of said complementary PWM signals;
generating full duty cycle PWM signals and gradually shifting their relative phase between in-phase and out-of-phase; and
in response to a turn-on signal, adjusting the in-phase PWM signals from low to full duty cycle and shifting the relative phase from in-phase to out-of-phase, and in response to a turn-off signal shifting the relative phase from out-of-phase to in-phase and adjusting the in-phase PWM signals from full to low duty cycle for maintaining balanced charge on the demodulation filter to reduce audible noise.

15. The method of noise reduction of claim 14 further including a synchronization circuit for synchronizing the out-of-phase full duty cycle PWM signals from the out-phasing circuit with the complementary PWM signals.

16. The method of noise reduction of claim 14 in which said full duty cycle is a 50% duty cycle.

17. A noise reduction system for a switching amplifier system including a differential output stage and demodulator filter responsive to complementary PWM signals, said noise reduction system comprising:
a charging circuit for generating in-phase PWM signals and gradually adjusting their duty cycle between a low duty cycle and the full duty cycle of said complementary PWM signals;
an out-phasing circuit for generating full duty cycle PWM signals and gradually shifting their relative phase between in-phase and out-of-phase; and
a control circuit responsive to a turn-on signal to enable said charging circuit to adjust the in-phase PWM signals from low to full duty cycle and enable said out-phasing circuit to shift the relative phase from in-phase to out-of-phase, for maintaining balanced charge on the demodulation filter to reduce audible noise.

18. A noise reduction system for a switching amplifier system including a differential output stage and demodulator filter responsive to complementary PWM signals, said noise reduction system comprising:
a charging circuit for generating in-phase PWM signals and gradually adjusting their duty cycle between a low duty cycle and the full duty cycle of said complementary PWM signals;
an out-phasing circuit for generating full duty cycle PWM signals and gradually shifting their relative phase between in-phase and out-of-phase; and
a control circuit responsive to a turn-off signal to enable said out-phasing circuit to shift the relative phase from out-of-phase to in-phase and enable said charging circuit to adjust the in-phase PWM signals from full to low duty cycle for maintaining balanced charge on the demodulation filter to reduce audible noise.

19. A method of noise reduction for a switching amplifier system including a differential output stage and demodulator filter responsive to complementary PWM signals comprising:
generating in-phase PWM signals and gradually adjusting their duty cycle between a low duty cycle and the full duty cycle of said complementary PWM signals;
generating full duty cycle PWM signals and gradually shifting their relative phase between in-phase and out-of-phase; and
in response to a turn-on signal adjusting the in-phase PWM signals from low to full duty cycle and shifting the relative phase from in-phase to out-of-phase, for maintaining balanced charge on the demodulation filter to reduce audible noise.

20. A method of noise reduction for a switching amplifier system including a differential output stage and demodulator filter responsive to complementary PWM signals comprising:
generating in-phase PWM signals and gradually adjusting their duty cycle between a low duty cycle and the full duty cycle of said complementary PWM signals;
generating full duty cycle PWM signals and gradually shifting their relative phase between in-phase and out-of-phase; and
in response to a turn-off signal, shifting the relative phase from out-of-phase to in-phase and adjusting the in-phase PWM signals from full to low duty cycle for maintaining balanced charge on the demodulation filter to reduce audible noise.

* * * * *